(12) United States Patent
Alpert et al.

(10) Patent No.: US 8,930,873 B1
(45) Date of Patent: Jan. 6, 2015

(54) CREATING REGIONAL ROUTING BLOCKAGES IN INTEGRATED CIRCUIT DESIGN

(71) Applicant: International Business Machines Corporation, Armonk, NY (US)

(72) Inventors: Charles Jay Alpert, Austin, TX (US); Zhuo Li, Austin, MN (US); Gi-Joon Nam, Austin, TX (US); Sven Peyer, Tuebingen (DE); Sourav Saha, Kolkata (IN); Chin Ngai Sze, Austin, TX (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/081,563

(22) Filed: Nov. 15, 2013

(51) Int. Cl.
*G06F 17/50* (2006.01)

(52) U.S. Cl.
CPC ........ *G06F 17/5081* (2013.01); *G06F 17/5077* (2013.01); *G06F 17/5072* (2013.01)
USPC ........... 716/130; 716/129; 716/123; 716/122; 716/111; 716/136

(58) Field of Classification Search
CPC ............ G06F 17/5081; G06F 17/5077; G06F 17/5072
USPC .......... 716/130, 129, 123, 122, 111, 132, 136
See application file for complete search history.

(56) References Cited

U.S. PATENT DOCUMENTS

| | | | |
|---|---|---|---|
| 4,615,011 A * | 9/1986 | Linsker | 716/126 |
| 5,657,242 A * | 8/1997 | Sekiyama et al. | 716/126 |
| 5,784,289 A | 7/1998 | Wang | |
| 7,299,442 B2 | 11/2007 | Alpert et al. | |
| 7,634,751 B2 * | 12/2009 | Ueda | 716/110 |
| 7,930,669 B2 | 4/2011 | Lavin et al. | |
| 8,065,652 B1 * | 11/2011 | Salowe et al. | 716/139 |
| 8,112,733 B2 | 2/2012 | Frankle et al. | |
| 8,171,445 B2 * | 5/2012 | Ueda | 716/126 |
| 8,386,970 B2 * | 2/2013 | Ueda | 716/54 |

(Continued)

OTHER PUBLICATIONS

Cho et al; BoxRouter 2.0: A Hybrid and Robust Global Router with Layer Assignment for Routability, ACM Transactions on Design Automation of Electronic Systems, vol. 14, No. 2, Article 32, See section 5, Pub. date: Mar. 2009.

(Continued)

*Primary Examiner* — Phallaka Kik
(74) *Attorney, Agent, or Firm* — Garg Law Firm, PLLC; Rakesh Garg; William J. Stock

(57) ABSTRACT

A region of congestion is detected at a set of layers. The region occupies the same area of each layer in the set. A routing blockage is defined as a tuple corresponding to the region. The tuple includes a set of coordinates to describe an area of the region, a first and a second layer coordinates of a first and a second layer in the set of layers. The routing blockage is applied during an iteration of rough routing. Before an iteration of detailed routing, the routing blockage is removed. Detailed routing is performed using a g-cell in the region. The detailed routing uses a routing capacity saved in the g-cell during the iteration of rough routing due to the routing blockage. A revised IC design is produced where a revised congestion in an area corresponding to the region is reduced.

20 Claims, 16 Drawing Sheets

(56) References Cited

U.S. PATENT DOCUMENTS

| | | | |
|---|---|---|---|
| 8,418,113 B1* | 4/2013 | Alpert et al. | 716/129 |
| 8,584,070 B2* | 11/2013 | Alpert et al. | 716/129 |
| 2007/0162882 A1* | 7/2007 | Ueda | 716/13 |
| 2010/0042957 A1* | 2/2010 | Ueda | 716/2 |
| 2011/0246955 A1 | 10/2011 | Ohtsuka et al. | |
| 2012/0180007 A1* | 7/2012 | Ueda | 716/55 |
| 2013/0047130 A1* | 2/2013 | Daellenbach et al. | 716/113 |
| 2013/0086544 A1* | 4/2013 | Alpert et al. | 716/129 |
| 2013/0086545 A1* | 4/2013 | Alpert et al. | 716/129 |

OTHER PUBLICATIONS

Saxena et al; Routing Congestion in VLSI Circuits—Estimation and Optimization . . . Springer. ISBN: 978-0-387-30037, 2007.

Mitra et al; Radar: RET-Aware Detailed Routing Using Fast Lithography Simulations, 369-372, DAC2005, Jun. 13-17, 2005, Copyright 2005, Anaheim, California, USA.

* cited by examiner

CREATING REGIONAL ROUTING BLOCKAGES IN INTEGRATED CIRCUIT DESIGN

TECHNICAL FIELD

The present invention relates generally to a method, system, and computer program product for providing a design of an integrated circuit. More particularly, the present invention relates to a method, system, and computer program product for creating regional routing blockages in integrated circuit design.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic. The components in modern day electronics generally appear to be rectangular black plastic packages with connector pins protruding from the plastic encasement.

Circuit designers use a variety of software tools to design electronic circuits of an IC. The software tools used for designing an IC produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry. An interconnected group of components is called a net.

An IC may use many layers of silicon to implement a circuit. In other words, components forming the circuit may be placed on different layers of silicon in a chip. Interconnects connecting the components on one layer to components on different layers go through the silicon layer. Such interconnects are also known as Through Silicon Vias (TSVs, or via).

The software tools manipulate these components at the components level, or blocks of components level. A block of components is also known as a global cell or g-cell. A g-cell in an IC design is a portion of the IC design. One way of identifying g-cells in an IC design is to overlay a grid of imaginary vertical and horizontal lines on the design, and deeming each portion of the IC design bound by horizontal and vertical lines as a g-cell. The horizontal or vertical lines bounding a g-cell are called cut-lines.

Imposing such a grid on an IC design abstracts the global routing problem away from the actual wire implementation and gives a more mathematical representation of the task. A net may span one or more g-cells and may cross several cut lines.

An IC design software tool can, among other functions, manipulate cells, or interconnect components of one cell with components of other cells, such as to form nets. Such a cell is distinct from the g-cell in that this cell is a logic component, such as a semiconductor gate. The interconnects between components are called wires. A wire is a connection between parts of electronic components, and is formed using a metallic material that conducts electricity.

Placement problem is the problem of placing the cells of a chip such that the design meets all the design parameters of the chip. Routing is the process of connecting the pins after placement. In other words, placement results in a rendering of the components of various cells as being located in certain positions in the design, whereas routing results in a rendering of how the metal layers would be populated with that placement.

A wire can be designed to take any one of the several available paths in a design. Placement of a wire on a certain path, or track, is a part of routing.

A layer is typically designated to accommodate wires of a certain width (wire code). Generally, the wider the wire width of a layer, the faster the net routed on that layer. Faster layers, to with, layers with larger wire widths, can accommodate fewer components or nets as compared to slower layers with narrower wire widths.

A router is a component of an IC design tool that performs the routing function. Once the placement component—known as a placer—has performed the placement function, the router attempts to connect the wires without causing congestion. For example, if a design parameter calls for no more than five wires in a given area, the router attempts to honor that restriction in configuring the wiring. Such limitations on the wiring are a type of design constraints and are called congestion constraints.

A global router divides the routing region into small tiles (g-cells) and attempts to route nets through the g-cells such that no g-cell overflows its capacity. Global routing, or rough routing, is the process of connecting a g-cell to other g-cells.

After global routing, wires must be assigned to actual tracks within each tile, followed by detailed routing, which must connect each global route to the actual pin shape on the cell. Another type of router—known as the detailed router—performs the detailed routing. The global and detailed routing produced during the design process is collectively referred to as "routing" and is usually further modified during optimization of the design.

SUMMARY

The illustrative embodiments provide a method, system, and computer program product for creating regional routing blockages in integrated circuit design. An embodiment includes a method for reducing congestion using regional routing blockages in an integrated circuit (IC) design. The embodiment detects, at a set of layers in the IC design, a region of congestion, such that the region occupies the same area of each layer in the set of layers. The embodiment defines, as a tuple, a routing blockage corresponding to the region, wherein the tuple comprises a set of coordinates to describe an area of the region, a first layer coordinate of a first layer in the set of layers, and a second layer coordinate in the set of layers. The embodiment applies the routing blockage during an iteration of rough routing of the IC design. The embodiment removes, before an iteration of detail routing iteration of the IC design, the routing blockage. The embodiment performs detail routing using a g-cell in the region, wherein the detail routing uses a routing capacity saved in the g-cell during the iteration of rough routing due to the routing blockage. The embodiment outputs a revised IC design, wherein in the revised design a revised congestion in an area corresponding to the region is less than a congestion in the region in the IC design.

Another embodiment includes a computer usable program product comprising a computer usable storage device including computer usable code for reducing congestion using regional routing blockages in an integrated circuit (IC) design. The embodiment further includes computer usable code for detecting, at a set of layers in the IC design, a region of congestion, such that the region occupies the same area of each layer in the set of layers. The embodiment further includes computer usable code for defining, as a tuple, a routing blockage corresponding to the region, wherein the tuple comprises a set of coordinates to describe an area of the region, a first layer coordinate of a first layer in the set of layers, and a second layer coordinate in the set of layers. The embodiment further includes computer usable code for applying the routing blockage during an iteration of rough routing of the IC design. The embodiment further includes computer usable code for removing, before an iteration of detail routing iteration of the IC design, the routing blockage. The embodiment further includes computer usable code for performing detail routing using a g-cell in the region, wherein the detail routing uses a routing capacity saved in the g-cell during the iteration of rough routing due to the routing blockage. The embodiment further includes computer usable code for outputting a revised IC design, wherein in the revised design a revised congestion in an area corresponding to the region is less than a congestion in the region in the IC design.

Another embodiment includes a data processing system for reducing congestion using regional routing blockages in an integrated circuit (IC) design. The embodiment further includes a storage device including a storage medium, wherein the storage device stores computer usable program code. The embodiment further includes a processor, wherein the processor executes the computer usable program code. The embodiment further includes computer usable code for detecting, at a set of layers in the IC design, a region of congestion, such that the region occupies the same area of each layer in the set of layers. The embodiment further includes computer usable code for defining, as a tuple, a routing blockage corresponding to the region, wherein the tuple comprises a set of coordinates to describe an area of the region, a first layer coordinate of a first layer in the set of layers, and a second layer coordinate in the set of layers. The embodiment further includes computer usable code for applying the routing blockage during an iteration of rough routing of the IC design. The embodiment further includes computer usable code for removing, before an iteration of detail routing iteration of the IC design, the routing blockage. The embodiment further includes computer usable code for performing detail routing using a g-cell in the region, wherein the detail routing uses a routing capacity saved in the g-cell during the iteration of rough routing due to the routing blockage. The embodiment further includes computer usable code for outputting a revised IC design, wherein in the revised design a revised congestion in an area corresponding to the region is less than a congestion in the region in the IC design.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
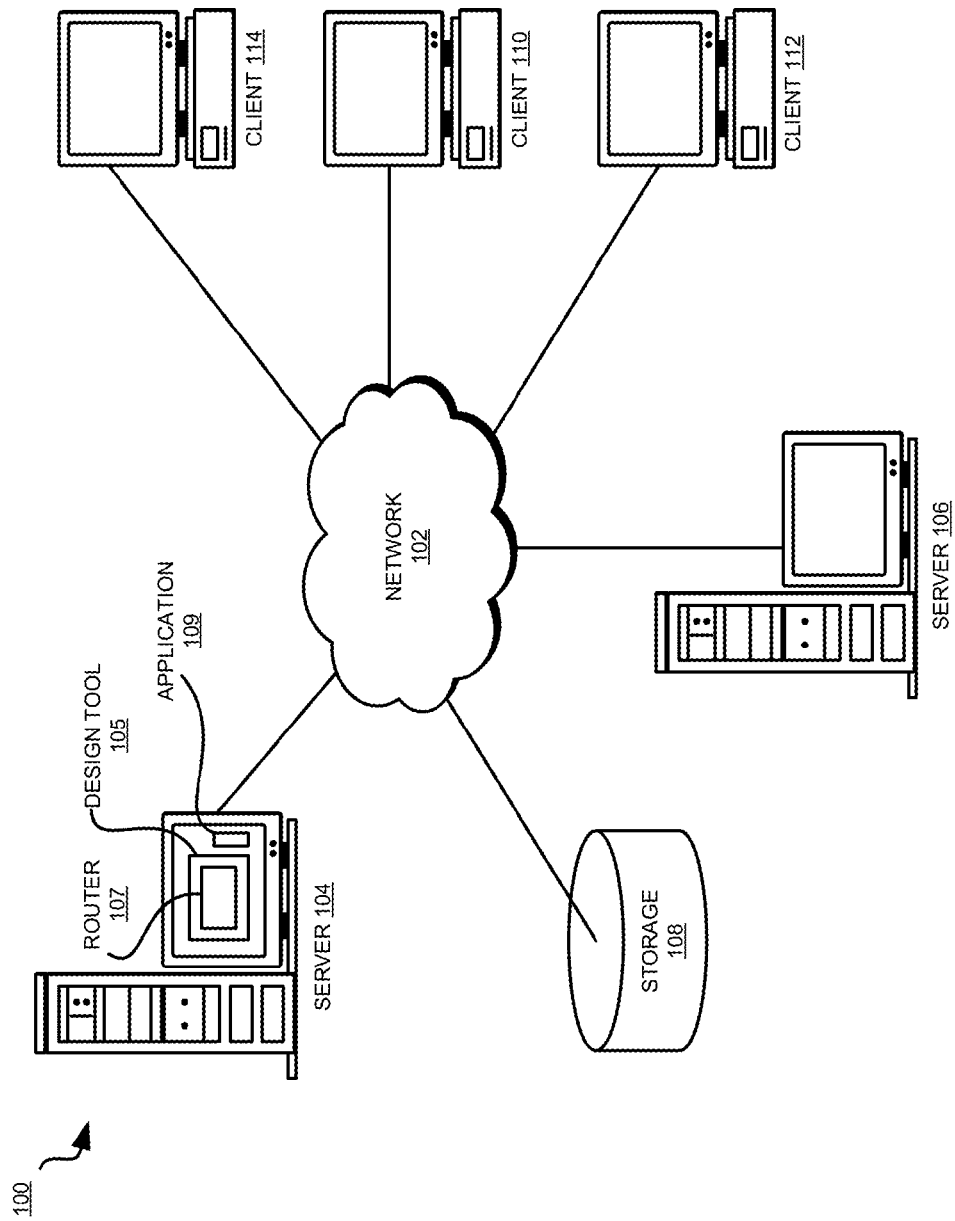
FIG. 1 depicts a block diagram of a network of data processing systems in which illustrative embodiments may be implemented.

Generally, a blockage is an area in a design that is prohibited for a particular purpose. Specifically, presently used blockages, or blocked areas, prohibit one of two actions. A placement-type blockage prohibits placing a component or a cell in the area occupied by the blockage. The presently used placement-type blockage remains off-limits for cell placement throughout the design process. A routing-type blockage prohibits placing a wire in the blocked area. The presently used routing-type blockage, again, remains off-limits for routing wires throughout the design process.

The illustrative embodiments recognize that presently, even if some precautionary measures against congestion are taken during rough routing, once an IC design (design) has been detailed routed, the design still exhibits areas of congestion. The illustrative embodiments further recognize that the congestion can exist in regions scattered across multiple layers of the design.

The illustrative embodiments further recognize that presently used methods for creating blockages do not successfully address routing congestion seen in detailed routing maps of a design. Furthermore, the presently used blockages cannot be used for alleviating a congestion problem in the design.

The illustrative embodiments used to describe the invention generally address and solve the above-described problems and other problems related to routing congestion in an IC design. The illustrative embodiments provide a method, system, and computer program product for creating regional routing blockages in integrated circuit design.

An embodiment identifies a region of congestion on one or more layers in a detailed routed IC design. The embodiment defines a region of congestion at a layer using a seven element tuple (7-tuple). The 7-tuple of an embodiment is also usable to define several regions of congestion across several layers. Several embodiments describe different methods for identifying the regions of congestion that can be represented in one or more 7-tuples.

The 7-tuple is used in rough routing, such as in another iteration of global routing, as identifying routing blockages. The rough routing phase avoids routing through the routing blockages identified by one or more 7-tuples. Avoiding routing through a routing blockage during rough routing allows capacity to remain available in the g-cells in the routing blockage area to accommodate routes during the detailed routing.

An embodiment removes the routing blockages upon the completion of the rough routing phase of the design process. Thus, the embodiment makes the one or more previously routing blocked areas on one or more layers available for detailed routing. For the detailed routing of the design, the detailed routing phase of the design utilizes, among other areas, those areas that were identified as routing blockages during the rough routing phase. The resulting detailed routed design exhibits reduced congestion in the regions identified by a 7-tuple, as compared to the congestion in the same areas if the design is routed without the use of an embodiment.

The illustrative embodiments are described with respect to certain layers and semiconductor structures in an IC or IC design, data processing systems, environments, components, and applications only as examples. Any specific manifestations of such artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
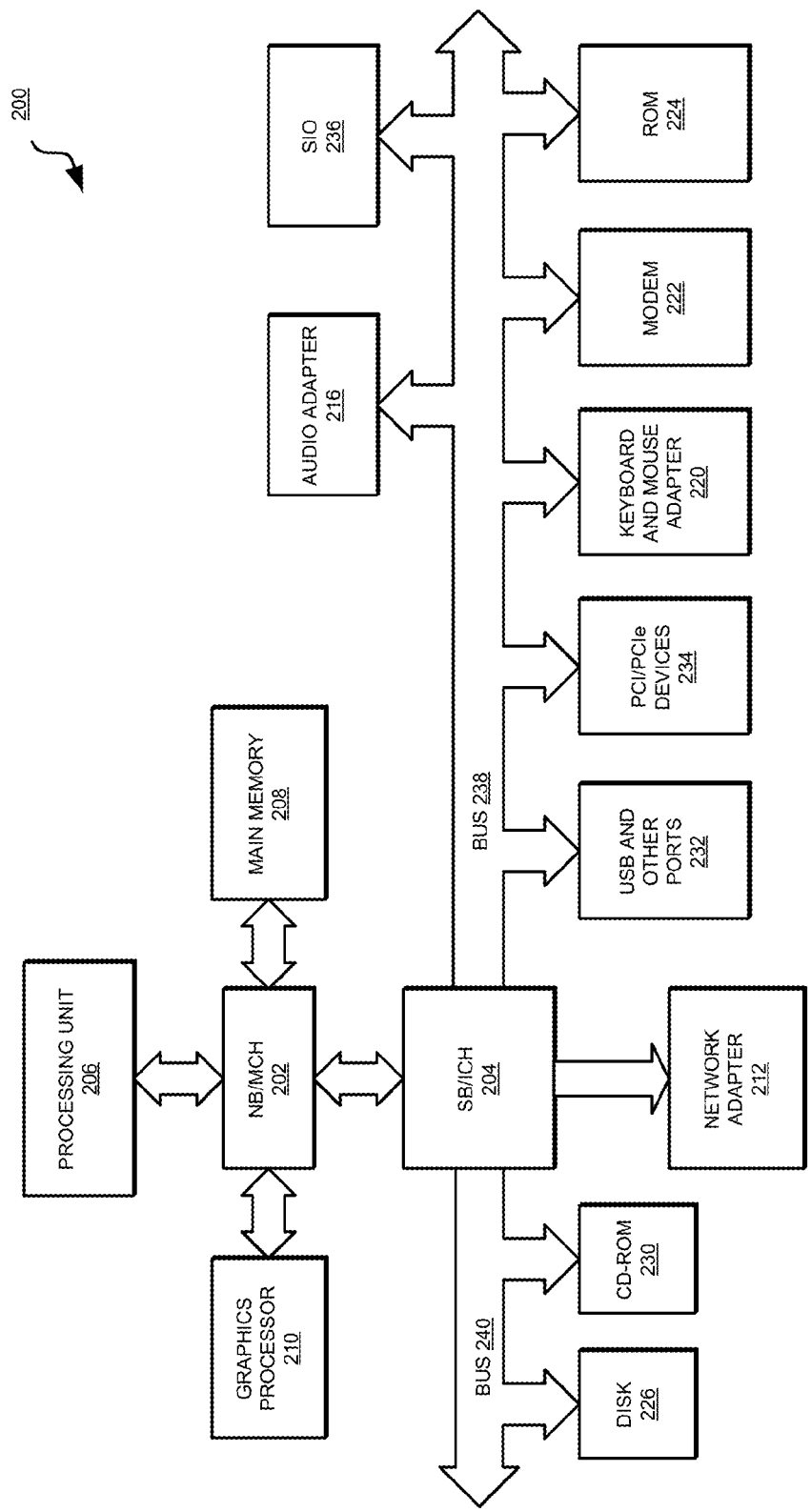
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Only as an example, and without implying any limitation to such architecture, FIG. 1 depicts certain components that are useable in an embodiment. For example, server 104 includes IC design tool 105. IC design tool 105 utilizes router 107 for global routing. Application 109 implements an embodiment described herein. Design tool 105, router 107, or a combination thereof, operates in conjunction with application 109 to identify regions of congestions, define and use routing blockages for global routing, and remove the routing blockages for the detailed routing. In one embodiment, design tool 105 is modified to include the features of application 109. In another embodiment, design tool 105 communicates with application 109, receives an output, such as one or more 7-tuples, from application 109, to perform an operation described herein.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, or another type of device in which computer usable program code or instructions implementing the processes may be located for the illustrative embodiments.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as design tool 105, router 107, and application 109 in FIG. 1, are located on storage devices, such as hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
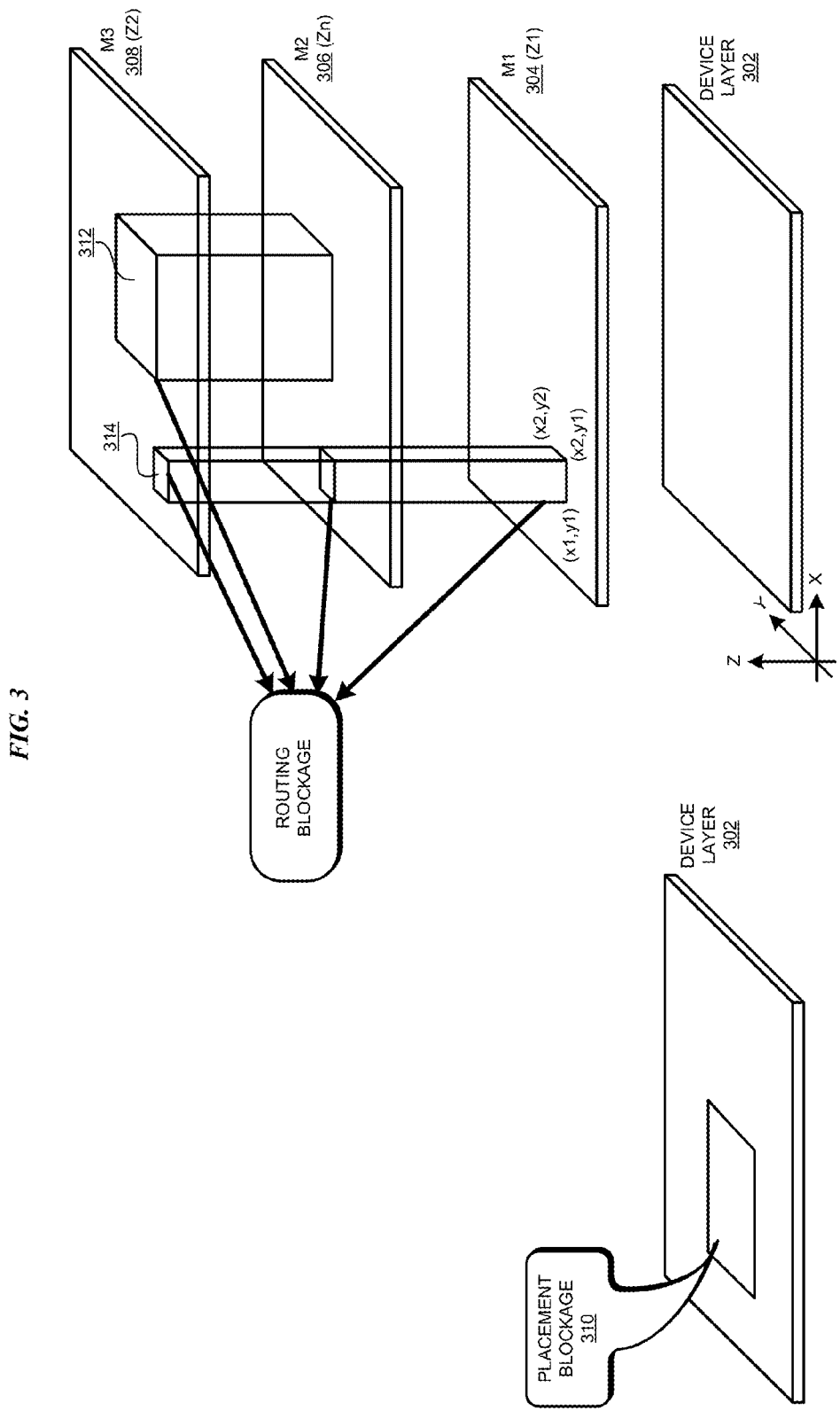
FIG. 3 depicts a set of routing blockages created in accordance with an illustrative embodiment.

With reference to FIG. 3, this figure depicts a set of routing blockages created in accordance with an illustrative embodiment. Layers 302, 304, 306, and 308 are example layers in an example IC design. Any number of layers are usable in the manner described herein within the scope of the illustrative embodiments. Only as an example, layer 302 is a device layer, to with, a layer on which semiconductor devices can be fabricated. Placement blockage 310 prohibits the placement (and subsequent fabrication) of semiconductor devices (cells) in the area covered by placement blockage 310.

Further as examples, layers 304, 306, and 308 are metal layers, to with, layers where wires can be placed for routing. An embodiment creates example routing blockages 312 and 314 in the layers used for routing, e.g., layers 304, 306, 308, or some combination thereof. For example, routing blockage 312 is depicted as a rectangular cuboid (rectangular prism) spanning two layers, layers 306 and 308, and identifies two example regions of congestion, one each on layers 306 and 308. The region of congestion on layer 306 is the area where the base plane of depicted rectangular cuboid 312 meets layer 306. The region of congestion on layer 308 is the area where the top plane of the depicted rectangular cuboid 312 meets layer 308.

Similarly, routing blockage 314 is depicted as a rectangular cuboid spanning three layers, layers 304, 306, and 308, and identifies three example regions of congestion, one each on layers 304, 306, and 308. The region of congestion on layer 304 is the area where the base plane of depicted rectangular cuboid 314 meets layer 304. The region of congestion on layer 306 is the cross-section area where rectangular cuboid 314 intersects layer 306. The region of congestion on layer 308 is the area where the top plane of the depicted rectangular cuboid 314 meets layer 308.

Imagine layers 302-308 are parallel to one another along X-axis and Y-axis plane as shown, and are layered along Z-axis as shown. The base of cuboid 314 starts at x-coordinate x1, ends at x-coordinate x2, starts at y-coordinate y1, and ends at y-coordinate y2 on plane z1 (layer 304). In other words, the region of congestion defined on layer 304 is the rectangle having vertices (x1,y1,z1), (x1,y2,z1), (x2,y1,z1), and (x2,y2,z1). Similarly, the region of congestion defined on plane z2 (layer 308) is the rectangle having vertices (x1,y1,z2), (x1,y2,z2), (x2,y1,z2), and (x2,y2,z2). Accordingly, an embodiment defines cuboid 314 by a six-tuple (x1,y1,z1,x2,y2,z2), to represent a cuboid bound by these base and top planes.

Any number of layers could intervene between z1 and z2. Accordingly, any number of layers can intersect with cuboid 314 to have an area of intersection defined as a region of congestion defined on those layers. For example, layer 306 has a z-coordinate zn, which is somewhere between z1 and z2. Accordingly, the region of congestion defined on layer 306 is the rectangle having vertices (x1,y1,zn), (x1,y2,zn), (x2,y1,zn), and (x2,y2,zn).

An embodiment further defines a ratio or percentage of routing blockage to impose on the regions of congestion at each layer. For example, when the blockage ratio for a routing blockage area is one hundred percent (100% or 1), no routes can occupy that routing blockage area. When the blockage ratio for a routing blockage area is fifty percent (50% or 0.5), routes can occupy only fifty percent of the capacity of that routing blockage area. Other blockage ratios operate on the corresponding routing blockage areas in a similar manner.

The blockage ratio added to the six-tuple definition of the routing blockage makes the 7-tuple according to an embodiment. For example, (0.2,x1,y1,z1,x2,y2,z2) is an example 7-tuple for routing blockage 314, which blocks each of regions (x1,y1,z1,x2,y2,z1), (x1,y1,z1,x2,y2,zn), and (x1,y1,z1,x2,y2,z2) by twenty percent. The placement of the blockage ratio in the 7-tuple is non-limiting on the illustrative embodiments. A 7-tuple can place the blockage ratio anywhere in the tuple within the scope of the illustrative embodiments. For example, the 7-tuple can be specified as (0.2,x1,y1,z1,x2,y2,z2), or (x1,y1,z1,x2,y2,z2,0.2), or (x1,y1,z1,0.2,x2,y2,z2) or other suitable forms, such as with additional values in an n-tuple (where n is more than 7) within the scope of the illustrative embodiments.

In one embodiment, the 7-tuple represents an area that bounds one or more full g-cells at each layer that the corresponding cuboid intersects. Configuring the 7-tuple to bound partial g-cells, to with, to create routing blockages in partial g-cells at a layer, is also contemplated within the scope of the illustrative embodiments.

In one embodiment, the 7-tuple represents a right cuboid, e.g., a cuboid where all internal angles are ninety degrees. In such as case, the cuboid intersects different layers at rectangular areas with same (x,y) coordinates. Furthermore, the 7-tuple can include the same values of z1 and z2, if the region of congestion is to be defined on only one layer.

Angled cuboids, such as a cuboid that intersects different layers at rectangular areas with different (x,y) coordinates are also contemplated within the scope of the illustrative embodiments. In some implementations, it may be possible to create routing blockage in partial g-cells, removing the need for defining regions of congestion as rectangles. Accordingly, angled prisms of other cross-sections, e.g., triangular, pentagonal, and other geometric or non-geometric shapes, are also contemplated within the scope of the illustrative embodiments. Such prisms of other cross-sectional shapes can be defined in any suitably sized tuple that is sufficient to define any number of points to define any shape for any number of layers.

Figure 4:
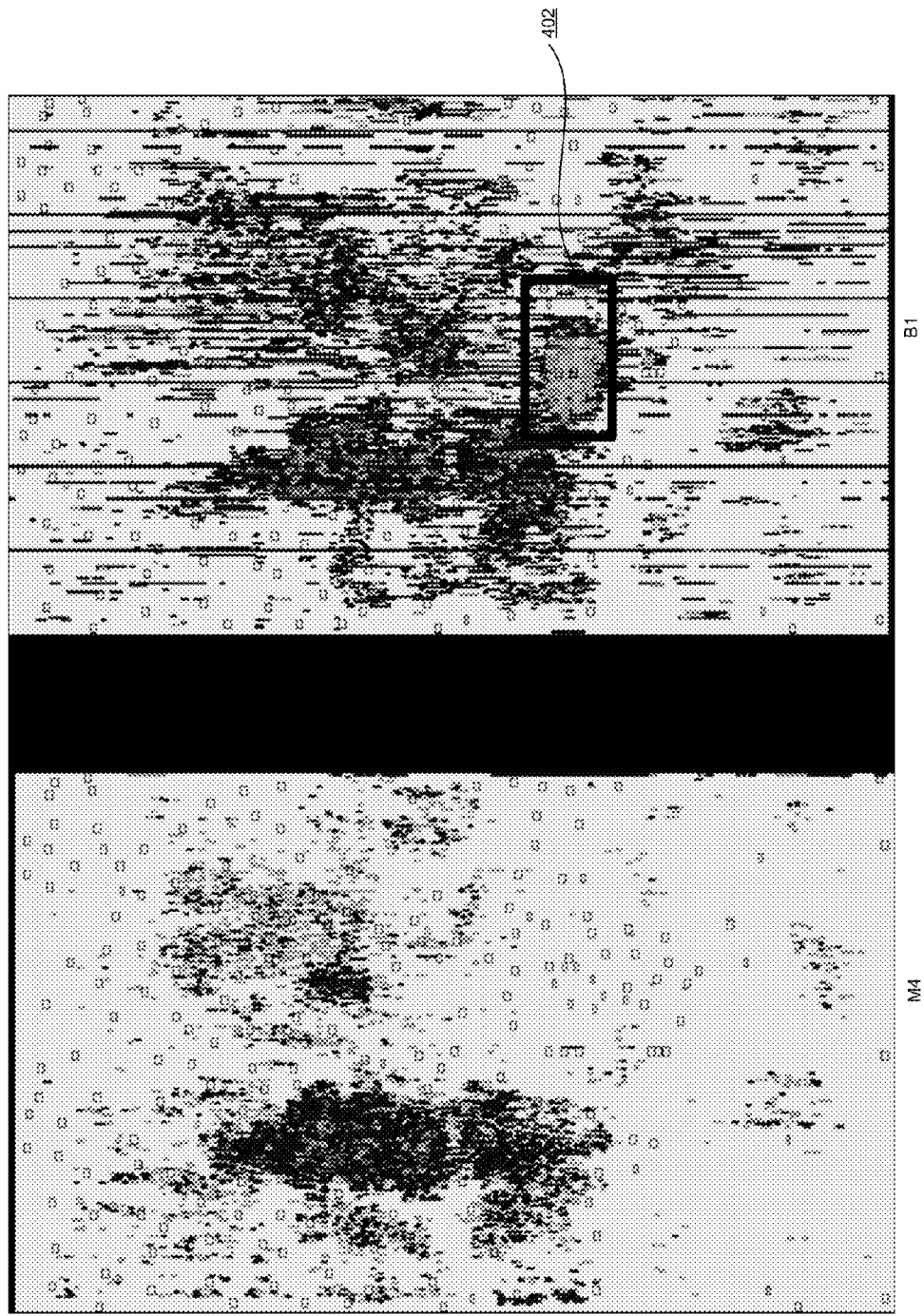
FIG. 4 depicts an example method for identifying a region of congestion on one or more layers in accordance with an illustrative embodiment.

With reference to FIG. 4, this figure depicts an example method for identifying a region of congestion on one or more layers in accordance with an illustrative embodiment. Layers M4 and B1 are example layers in the manner of layers 304, 306, or 308 in FIG. 3. For example, layer M4 can be a layer above layer 308 in FIG. 3, and layer B1 can be a layer several layers above layer M4 in a given design.

This figure depicts congestion maps of layers M4 and B1. One example of a congestion map of a layer is a detailed routing map of the layer. In some example design process, assume that layer B1 is over-utilized, favored, or otherwise used, (over-promoted), for routing. Accordingly, layer B1 becomes more congested than another layer, e.g., layer M4 as shown.

An embodiment, such as in application 109 in FIG. 1, compares the congestion maps of two or more layers, e.g., the congestion maps of layers M4 and B1, and perhaps of other zero or more layers. Only two layers are used in the following description for the clarity of the description and not to imply a limitation on the illustrative embodiments.

The application computes a difference between the congestion maps of layers M4 and B1. The application identifies region 402 in layer B1, amongst possibly other regions in layers B1, M4, or both, that is more congested than the corresponding region in layer M4. The application defines region 402 as a region of congestion on layer B1 and creates 7-tuple (k,x1,y1,z1,x2,y2,z1), z1 is the z-plane coordinate of layer B1, and where k is the blockage ratio to be imposed on the routing blockage defined by area {(x1,y1,z1),(x2,y2,z1)}.

Note that region 402 is depicted as a single rectangle only as an example and not as a limitation. Region 402 may be identified as one or more shapes, including rectangular shapes, each shape spanning any number of full and/or partial g-cells within the scope of the illustrative embodiments.

Figure 5:
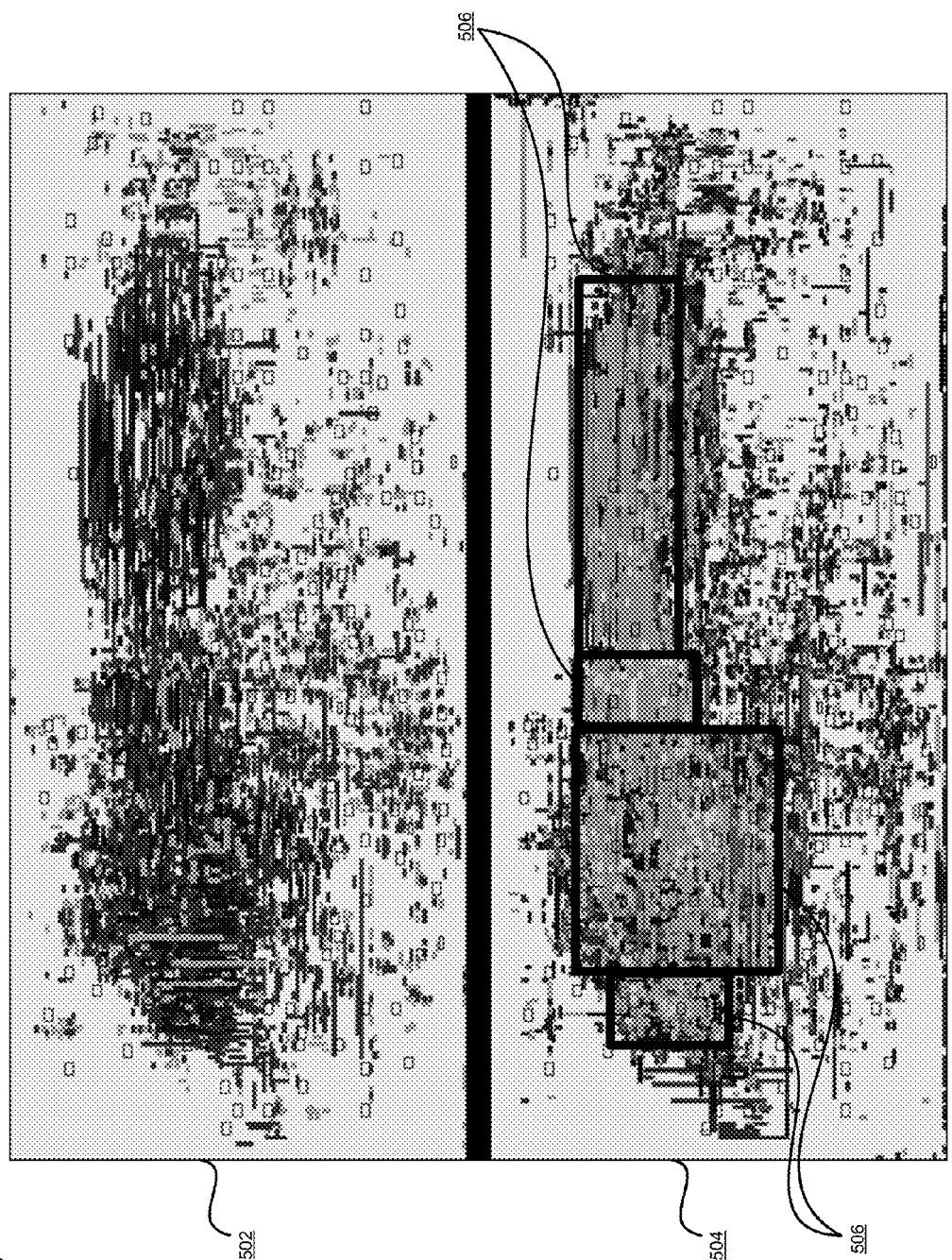
FIG. 5 depicts another example method for identifying a region of congestion on a layer in accordance with an illustrative embodiment.

With reference to FIG. 5, this figure depicts another example method for identifying a region of congestion on a layer in accordance with an illustrative embodiment. Map 502 is a rough routing map of a layer, such as of layer 308 in FIG. 3 or of layer B1 in FIG. 4. Map 504 is a detailed routing map of the same layer.

An embodiment, such as in application 109 in FIG. 1, compares routing maps 502 and 504. The application computes a difference between routing maps 502 and 504. In the layer, the application identifies regions 506 that are more congested than a threshold level of congestion for the layer. The application defines regions 506 by creating several 7-tuples with the same or different blockage ratios, e.g., (k,x1,y1,z1,x2,y2,z1), (l,x2,y3,z1,x3,y4,z1), and (m,x5,y5,z1,x6,y6,z1). Again, regions 506 are depicted as rectangles enclosing a number of whole g-cells only as an example and not as a limitation.

Figure 6:
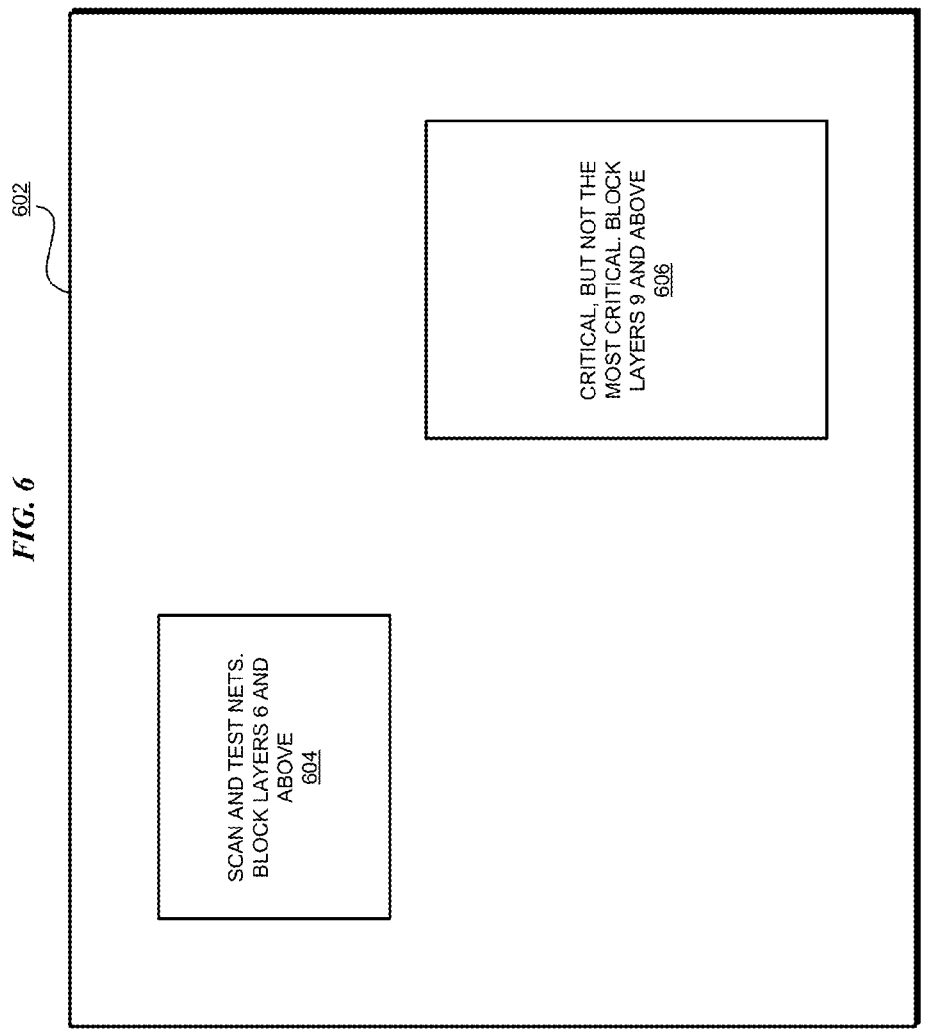
FIG. 6 depicts another example method for identifying regions of congestion on one or more layers in accordance with an illustrative embodiment.

With reference to FIG. 6, this figure depicts another example method for identifying regions of congestion on one or more layers in accordance with an illustrative embodiment. View 602 is conceptual top view of several layers in an IC design, such as a view of layers 308, 306, 304, and 302, and any layers intervening, above, or below layers 308, 306, 304, and 302 in FIG. 3.

An embodiment, such as in application 109 in FIG. 1, categorizes the nets in a given deign into various categories, e.g., according to function or purpose of the nets, performance requirements for the nets, or any other specification for the nets.

The application they identifies a set of one or more layers for each category of the nets. On a set of layers for a category of nets, the application then identifies one or more regions where some or all of all nets of the category should be routed. The application performs the region identification for each set of layers for each category of nets. The application then defines those regions as routing blockages using a tuple according to an embodiment.

An example embodiment using a simplistic design and conceptual view 602 is depicted in FIG. 6. The embodiment has identified two example categories of nets in the example simple design, namely, a category of those nets that are for scanning and testing purposes, and another category of those nets that are not the most critical but are critical according to a criticality factor (e.g., within a range of timing). The embodiment has identified region 604 on layer number 6 (or other layer identifier) and above, where the scan and test nets should be routed. Similarly, the embodiment has identified region 606 on layer number 9 (or other layer identifier) and above, where the critical nets should be routed.

The application defines regions 604 and 606 by creating several 7-tuples with the same or different blockage ratios, e.g., (k,x1,y1,z1,x2,y2,z2) and (m,x5,y5,z5,x6,y6,z6). Again, regions 640 and 606 are depicted as rectangles enclosing a number of whole g-cells only as an example and not as a limitation.

Figure 7:
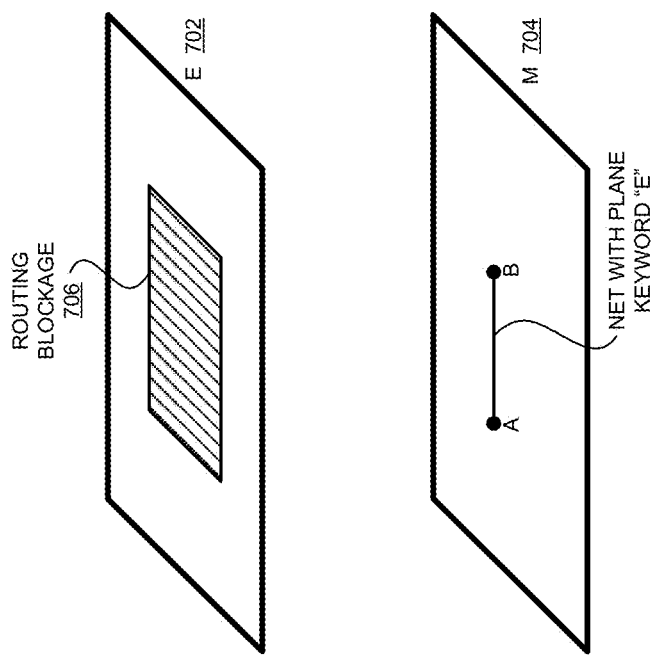
FIG. 7 depicts another example method for identifying regions of congestion on one or more layers in accordance with an illustrative embodiment.

With reference to FIG. 7, this figure depicts another example method for identifying regions of congestion on one or more layers in accordance with an illustrative embodiment. Layer 702 is an E layer in an example design, and layer 704 is an M layer, e.g., layer 308 in FIG. 3 in the example design.

An embodiment, such as in application 109 in FIG. 1, identifies a net AB (net begins at component A and ends at component B) in a routing map, e.g., in a detailed routing map of the example design. The application determines that net AB is specified with a plane keyword "E". A plane keyword is an indication associated with a net, the indication denoting a preferred layer where the net should be routed. Plane keyword "E" of net AB indicates that layer E is the desirable layer for net AB. The application determines that net AB is not routed on E layer 702 but on M layer 704.

The application identifies one or more regions 706 on E layer 702 where net AB should be routed. The application performs similar region identification for any number of nets on any number of layers in a given design. The application then defines those regions as routing blockages using a tuple according to an embodiment. For example, the application defines region 706 on E layer 702 as (k,x1,y1,zE,x2,y2,zE), where k is any suitable blockage ratio, and zE is the z-coordinate of E layer 702. Again, region 706 is depicted as a rectangle enclosing a number of whole g-cells only as an example and not as a limitation.

Figure 8:
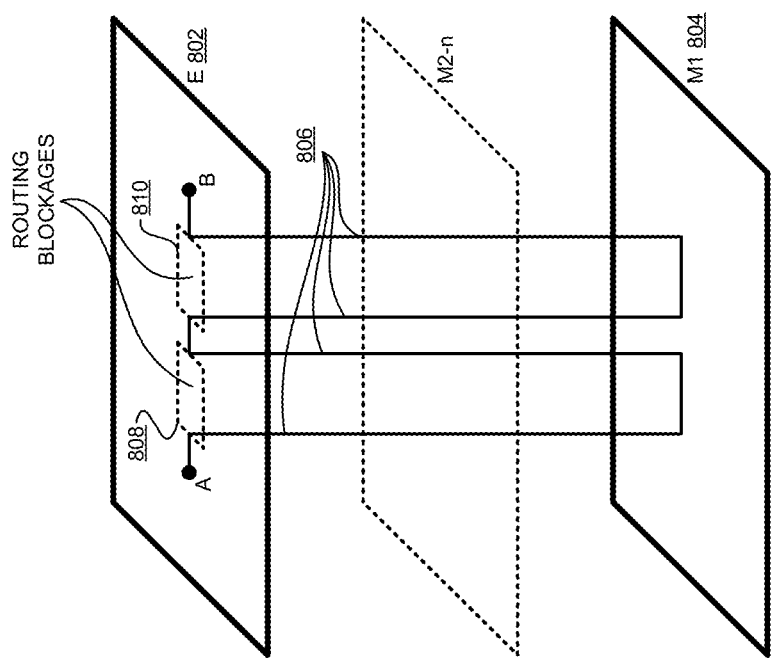
FIG. 8 depicts another example method for identifying regions of congestion on one or more layers in accordance with an illustrative embodiment.

With reference to FIG. 8, this figure depicts another example method for identifying regions of congestion on one or more layers in accordance with an illustrative embodiment. Layer 802 is an E layer in an example design, such as e layer 702 in FIG. 7. Layer 704 is an M1 layer, e.g., layer 304 in FIG. 3 in the example design. Layers M2-Mn are any number of intervening M layers or other layers between layers 802 and 804.

An embodiment, such as in application 109 in FIG. 1, identifies a net AB (net begins at component A and ends at component B) in a routing map, e.g., in a detailed routing map of the example design. The application determines that net AB is routed using a via structure. In one embodiment, net AB is identified if net AB uses any number of vias. In another embodiment, net AB is identified if net AB uses more than a threshold number of vias.

The application determines that net AB is routed on E layer 802 but using vias 806 down to M1 layer 804. The application determines that vias 806 are used for net AB because net AB cannot be routed through areas 808 and 810 for a straight path.

The application identifies regions 808 and 810 on E layer 802 where net AB should be routed. The application performs similar region identification for any number of nets on any number of layers in a given design. The application then defines those regions as routing blockages using a tuple according to an embodiment. For example, the application defines region 808 on E layer 802 as (k,x1,y1,zE,x2,y2,zE), where k is any suitable blockage ratio, and zE is the z-coordinate of E layer 802. Similarly, the application defines region 810 on E layer 802 as (m,x3,y3,zE,x4,y4,zE), where m is same or different from blockage ratio k. Again, regions 808 and 810 depicted as a rectangular routing blockages enclosing a number of whole g-cells only as an example and not as a limitation.

Figure 9:
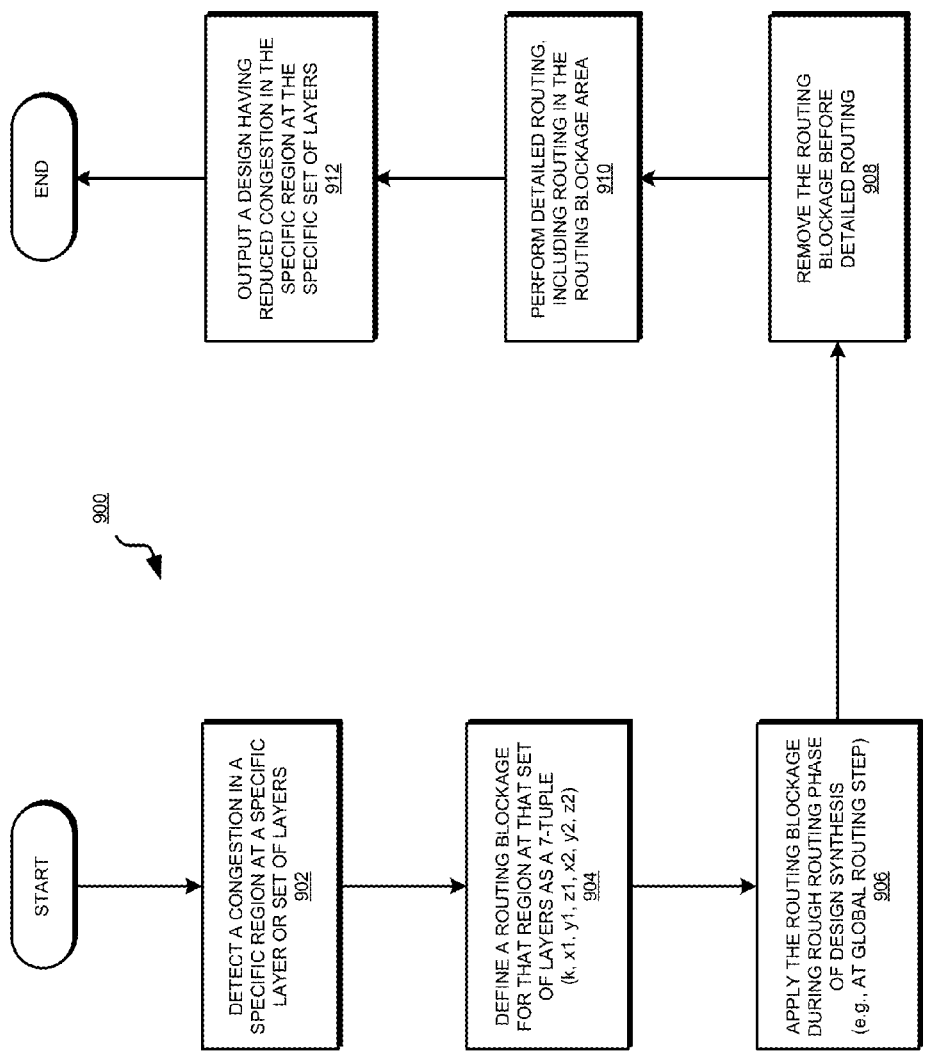
FIG. 9 depicts a flowchart of an example process for creating regional routing blockages in integrated circuit design in accordance with an illustrative embodiment.

With reference to FIG. 9, this figure depicts a flowchart of an example process for creating regional routing blockages in integrated circuit design in accordance with an illustrative embodiment. Process 900 can be implemented in application 109 in FIG. 1.

The application detects congestion, e.g., congestion above a threshold level of congestion, in a region at a layer or set of layers (block 902). The application defines a routing blockage for that region at that set of layers as a 7-tuple (block 904).

The application applies the routing blockage during rough routing phase of design synthesis, such as in the global routing step (block 906). The application removes the routing blockage after the rough routing phase but before detailed routing begins (block 908). The application performs detailed routing, including routing in the areas that were identified as routing blockages during rough routing (block 910). The application outputs a design, having reduced the congestion in the region in the set of layers detected in block 902 (block 912). The application ends process 900 thereafter.

Figure 10:
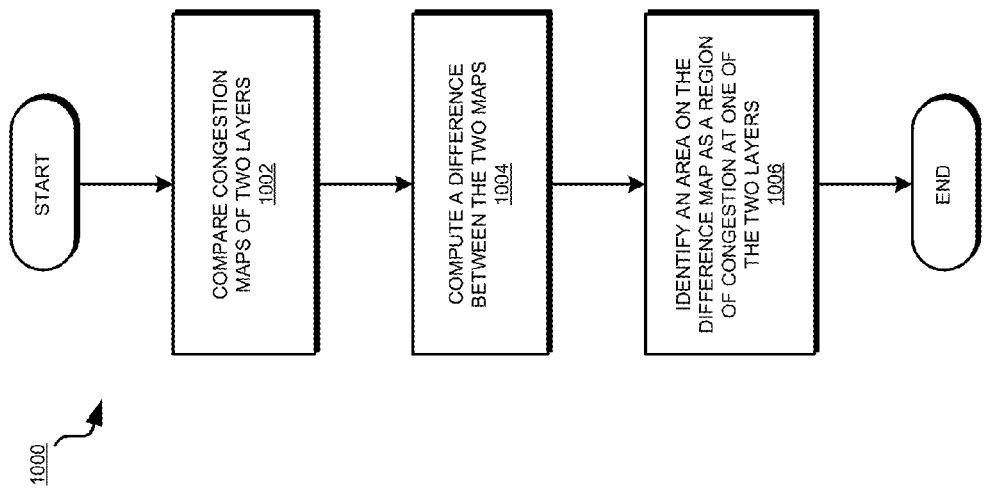
FIG. 10 depicts a flowchart of an example process for identifying an area on a set of layers as a routing blockage in accordance with an illustrative embodiment.

With reference to FIG. 10, this figure depicts a flowchart of an example process for identifying an area on a set of layers as a routing blockage in accordance with an illustrative embodiment. Process 1000 can be implemented in application 109 in FIG. 1. Process 1000 can be used in block 902 in FIG. 9.

The application compares congestion maps of two or more layers (block 1002). The application computes a difference map containing the differences between the two congestion maps (block 1004). On one of the two layers, the application identifies an area on the difference map as a region of congestion, such as an area where the congestion exceeds a threshold (block 1006). The application ends process 1000 thereafter.

Figure 11:
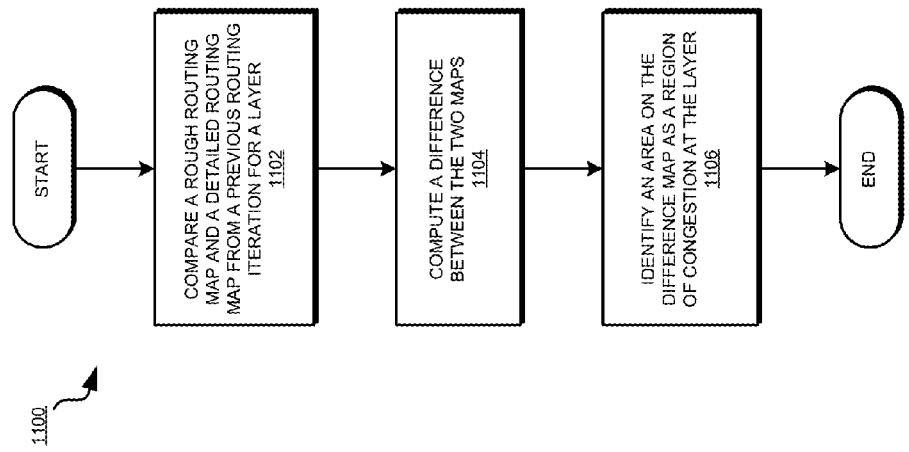
FIG. 11 depicts a flowchart of another example process for identifying an area on a set of layers as a routing blockage in accordance with an illustrative embodiment.

With reference to FIG. 11, this figure depicts a flowchart of another example process for identifying an area on a set of layers as a routing blockage in accordance with an illustrative embodiment. Process 1100 can be implemented in application 109 in FIG. 1. Process 1100 can be used in block 902 in FIG. 9.

The application compares a rough routing map and a detailed routing map for a layer, e.g., from a previous routing iteration (block 1102). The application computes a difference map containing the differences between the two routing maps (block 1104). The application identifies an area on the difference map as a region of congestion, such as an area where the congestion exceeds a threshold (block 1106). The application ends process 1100 thereafter.

Figure 12:
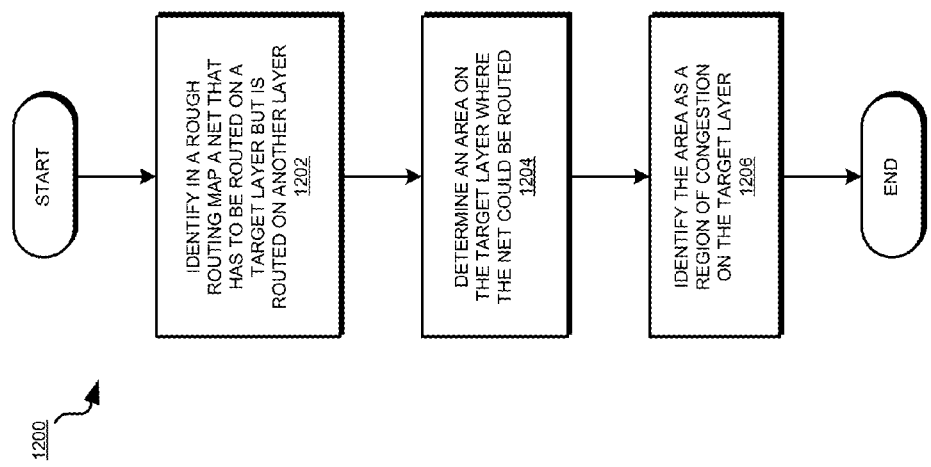
FIG. 12 depicts a flowchart of another example process for identifying an area on a set of layers as a routing blockage in accordance with an illustrative embodiment.

With reference to FIG. 12, this figure depicts a flowchart of another example process for identifying an area on a set of layers as a routing blockage in accordance with an illustrative embodiment. Process 1200 can be implemented in application 109 in FIG. 1. Process 1200 can be used in block 902 in FIG. 9.

In a rough routing map, the application identifies a net that has to be routed on a target layer but is routed on another layer (block 1202). The application determines an area on the target layer where the net could be routed (block 1204). The application identifies the area on the target layer as a region of congestion (block 1206). The application ends process 1200 thereafter.

Figure 13:
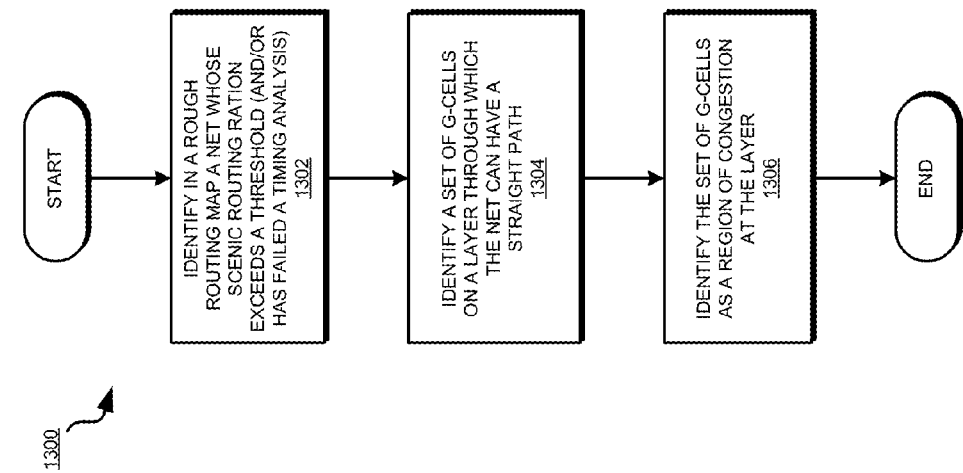
FIG. 13 depicts a flowchart of another example process for identifying an area on a set of layers as a routing blockage in accordance with an illustrative embodiment.

With reference to FIG. 13, this figure depicts a flowchart of another example process for identifying an area on a set of layers as a routing blockage in accordance with an illustrative embodiment. Process 1300 can be implemented in application 109 in FIG. 1. Process 1300 can be used in block 902 in FIG. 9.

In a rough routing map, the application identifies a net whose scenic routing ratio exceeds a threshold (block 1302). In one embodiment, additionally, or instead, the application determines whether a net has failed a timing analysis at block 1302. The application determines an area on a layer where the net could be routed in a straight path (block 1304). For example, the application identifies a set of g-cells on a layer through which the net can have a straighter path as compared to the scenic route in the rough routing. The application identifies the area on the layer as a region of congestion (block 1306). The application ends process 1300 thereafter.

In one embodiment, when the region of congestion is defined as a routing blockage tuple, the application assigns a blockage ratio to the routing blockage in proportion to the scenic ratio of the net. For example, a net with scenic ratio 3 may cause the blockage ratio of a routing blockage to be 0.5, whereas a net with scenic ratio 1.5 may cause the blockage ratio of a routing blockage to be 0.2.

In another embodiment, the blockage ratio of a routing blockage tuple is independent of the scenic ratio. For example, a net with scenic ratio 3 and a net with a scenic ratio of 1.5 may each cause routing blockages to be created by the application, but the blockage ratio of both routing blockages may be 0.2.

Figure 14:
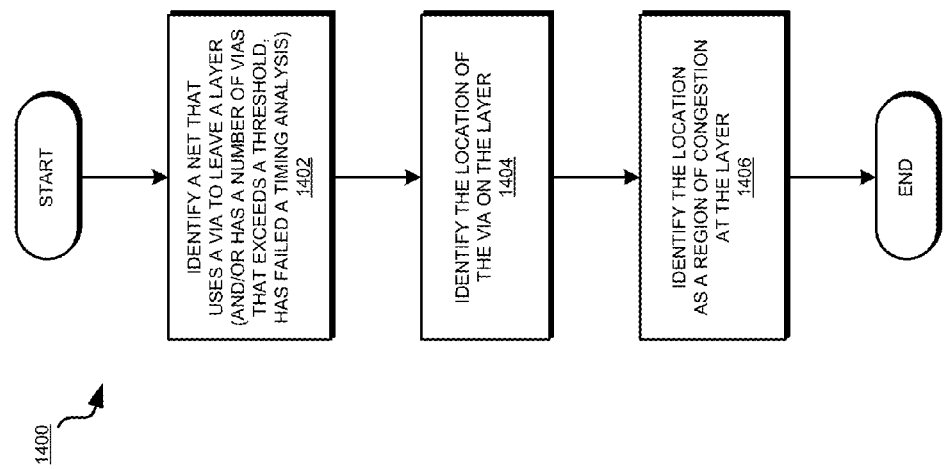
FIG. 14 depicts a flowchart of another example process for identifying an area on a set of layers as a routing blockage in accordance with an illustrative embodiment.

With reference to FIG. 14, this figure depicts a flowchart of another example process for identifying an area on a set of layers as a routing blockage in accordance with an illustrative embodiment. Process 1400 can be implemented in application 109 in FIG. 1. Process 1400 can be used in block 902 in FIG. 9.

In a rough routing map, the application identifies a net that uses a via leave a layer, or more generally, the via usage of the net exceeds a threshold number of vias (block 1402). In one embodiment, additionally, or instead, the application determines whether a net has failed a timing analysis at block 1402. In another embodiment, additionally, or instead, the application determines whether a net uses a number of vias that exceeds a threshold number of vias at block 1402.

The application a location of the via on the layer, to with, the location where the via connects to the layer (block 1404). The application identifies an area surrounding the location on the layer as a region of congestion (block 1406). The application ends process 1400 thereafter.

Figure 15:
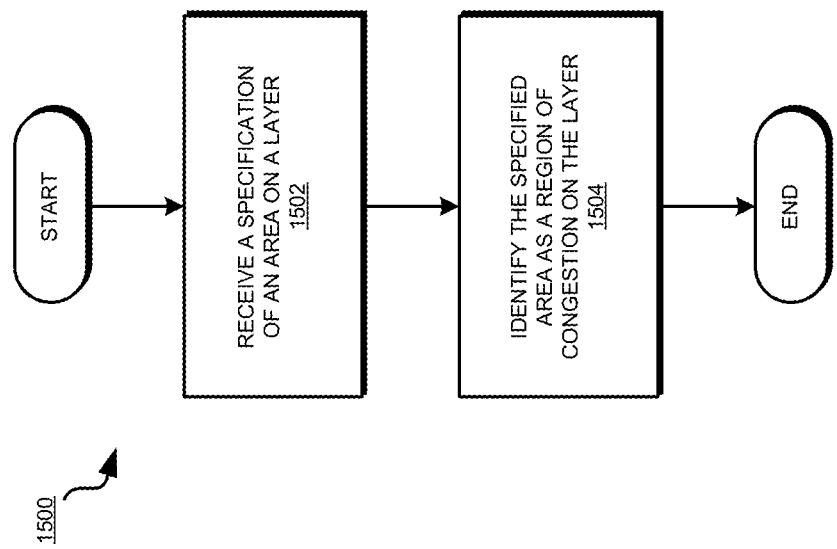
FIG. 15 depicts a flowchart of another example process for identifying an area on a set of layers as a routing blockage in accordance with an illustrative embodiment.

With reference to FIG. 15, this figure depicts a flowchart of another example process for identifying an area on a set of layers as a routing blockage in accordance with an illustrative embodiment. Process 1500 can be implemented in application 109 in FIG. 1. Process 1500 can be used in block 902 in FIG. 9.

The application receives a specification of an area to designate as congested, such as in the form of a design input from a user or application (block 1502). The application identifies the specified area as a region of congestion (block 1504). The application ends process 1500 thereafter.

Figure 16:
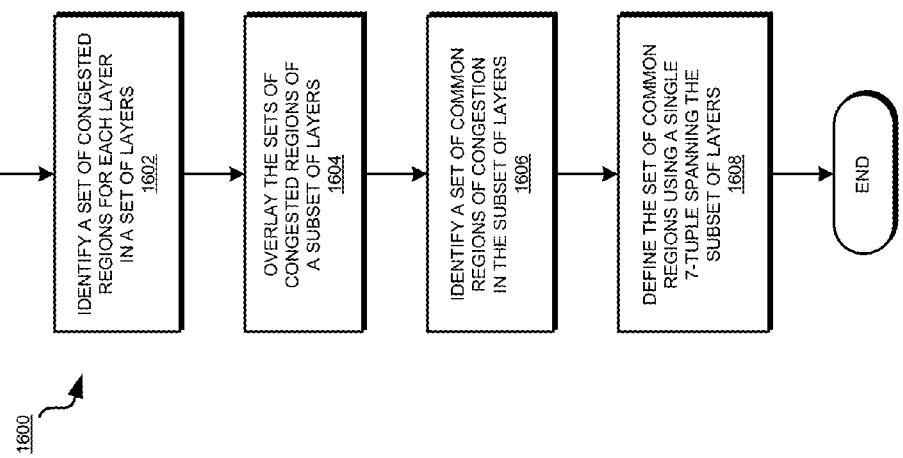
FIG. 16 depicts a flowchart of an example process for identifying an area as a routing blockage on more than one layer in accordance with an illustrative embodiment.

With reference to FIG. 16, this figure depicts a flowchart of an example process for identifying an area as a routing blockage on more than one layer in accordance with an illustrative embodiment. Process 1600 can be implemented in application 109 in FIG. 1. Process 1600 can be used in block 904 in FIG. 9.

In a rough routing map, the application identifies a set of congested regions for each layer in a set of layers (block 1602). For example, the application may detect a congested region in one layer using process 1000 of FIG. 10, detect a congested region in another layer using process 1100 of FIG. 11, and detect a congested region in a third layer using process 1200 of FIG. 12.

The application overlays the set of congested regions of a subset of layers (block 1604). For example, a congestion map is created for each layer and then superimposes the congested maps for a subset of layers on one another to form a combined congestion map.

The application identifies a set of common regions of congestion in the subset of layers (block 1606). A member of the set of common regions is a region on a layer with the same (x,y) coordinates as another region in the set for another layer. The application defines the set of common regions using a single 7-tuple routing blockage such that the 7-tuple spans all layers of the subset of layers (block 1608). The application ends process 1600 thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for creating regional routing blockages in integrated circuit design. The illustrative embodiments create routing blockages. The routing blockages reserve certain amount of routing capacity in certain g-cells during the rough routing phase. The illustrative embodiments remove the routing blockages before detailed routing begins. During detailed routing, the reserved routing capacity of those g-cells becomes available for placing detailed routes through those g-cells without congesting those g-cells, or at least congesting those g-cells less than the congestion that would occur without using an illustrative embodiment.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable storage medium. A computer readable storage device may be, for example, but not limited to, an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can store a program for use by or in connection with an instruction execution system, apparatus, or device. The term "computer readable storage device," or variations thereof, does not encompass a signal propagation media such as a copper cable, optical fiber or wireless transmission media.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for reducing congestion using regional routing blockages in an integrated circuit (IC) design, the method comprising:
    detecting, at a set of layers in the IC design, a region of congestion, such that the region occupies the same area of each layer in the set of layers;
    defining, as a tuple, a routing blockage corresponding to the region, wherein the tuple comprises a set of coordinates to describe an area of the region, a first layer coordinate of a first layer in the set of layers, and a second layer coordinate in the set of layers;

applying, using a processor and a memory, the routing blockage during an iteration of rough routing of the IC design;

removing, before a detailed routing iteration of the IC design, the routing blockage;

performing detailed routing using a g-cell in the region, wherein the detailed routing uses a routing capacity saved in the g-cell during the iteration of rough routing due to the routing blockage; and outputting a revised IC design, wherein in the revised design a revised congestion in an area corresponding to the region is less than a congestion in the region in the IC design.

2. The method of claim 1, wherein the detecting further comprises:

comparing a first congestion map of a first layer in the set of layers with a second congestion map of a second layer in the set of layers;

computing a difference map, wherein the difference map identifies an area on the first layer that is more congested than the area on the second layer; and identifying the area on the second layer as the region of congestion.

3. The method of claim 1, wherein the detecting further comprises:

comparing a rough routing map of a first layer in the set of layers with a detailed routing map of the first layer, the rough routing map and the detailed routing map having been created in a previous iteration of routing the IC design;

computing a difference map, wherein the difference map identifies an area on the first layer that is more congested in the detailed routing map of the first layer; and identifying the area on the first layer as the region of congestion.

4. The method of claim 1, wherein the detecting further comprises:

identifying, in a routing map of a first layer in the set of layers, a net, wherein a specification of the net identifies a second layer on which the net should be routed;

identifying an area on the second layer where the net can be routed; and identifying the area on the second layer as the region of congestion.

5. The method of claim 4, wherein the routing map is a detailed routing map of the first layer.

6. The method of claim 1, wherein the detecting further comprises:

identifying, in a routing map of a first layer in the set of layers, a net whose scenic route ratio exceeds a threshold;

identifying an area on the first layer, wherein the net can be routed in a straight path through a g-cell in the area; and identifying the area on the first layer as the region of congestion.

7. The method of claim 1, wherein the detecting further comprises:

identifying, in a routing map, a net that leaves a first layer in the set of layers using a via structure to reach a second layer in the set of layers;

identifying an area on the first layer, wherein the area includes a location where the via structure joins the first layer; and identifying the area on the first layer as the region of congestion.

8. The method of claim 7, wherein a number of via structures used in the net exceeds a threshold.

9. The method of claim 1, wherein a congestion in the region exceeds a threshold.

10. The method of claim 1, wherein the detecting further comprises:

detecting a first set of regions of congestion in a first layer in the set of layers;

detecting a second set of regions of congestion in a second layer in the set of layers; and determining a subset of regions that are common to the first set of regions and the second set of regions, wherein the region is a member of the subset of regions.

11. The method of claim 10, wherein the detecting the first set of regions and the detecting the second set of regions comprise different methods of identifying the region of congestion.

12. The method of claim 1, wherein the tuple is a seven-tuple, further comprising a blockage ratio, wherein the blockage ratio directs the iteration of rough routing to reserve routing capacity proportional to the blockage ratio in the g-cell in the region.

13. The method of claim 1, wherein the routing blockage causes the iteration of rough routing to save at least a portion of routing capacity in the g-cell in the region.

14. The method of claim 1, wherein the region comprises a rectangular area, the rectangular area comprising a set of g-cells, and wherein the routing blockage is represented as a cuboid intersecting with each layer in the set of layers such that an area of intersection with a layer is the region of congestion on that layer.

15. A computer usable program product comprising a computer usable storage device including computer usable code for reducing congestion using regional routing blockages in an integrated circuit (IC) design, the computer usable code comprising:

computer usable code for detecting, at a set of layers in the IC design, a region of congestion, such that the region occupies the same area of each layer in the set of layers;

computer usable code for defining, as a tuple, a routing blockage corresponding to the region, wherein the tuple comprises a set of coordinates to describe an area of the region, a first layer coordinate of a first layer in the set of layers, and a second layer coordinate in the set of layers;

computer usable code for applying the routing blockage during an iteration of rough routing of the IC design;

computer usable code for removing, before a detailed routing iteration of the IC design, the routing blockage;

computer usable code for performing detailed routing using a g-cell in the region, wherein the detailed routing uses a routing capacity saved in the g-cell during the iteration of rough routing due to the routing blockage; and computer usable code for outputting a revised IC design, wherein in the revised design a revised congestion in an area corresponding to the region is less than a congestion in the region in the IC design.

16. The computer usable program product of claim 15, wherein the computer usable code for detecting further comprises:

computer usable code for comparing a first congestion map of a first layer in the set of layers with a second congestion map of a second layer in the set of layers;

computer usable code for computing a difference map, wherein the difference map identifies an area on the first layer that is more congested than the area on the second layer; and computer usable code for identifying the area on the second layer as the region of congestion.

17. The computer usable program product of claim 15, wherein the computer usable code for detecting further comprises:
   computer usable code for comparing a rough routing map of a first layer in the set of layers with a detailed routing map of the first layer, the rough routing map and the detailed routing map having been created in a previous iteration of routing the IC design;
   computer usable code for computing a difference map, wherein the difference map identifies an area on the first layer that is more congested in the detailed routing map of the first layer; and
   computer usable code for identifying the area on the first layer as the region of congestion.

18. The computer usable program product of claim 15, wherein the computer usable code is stored in a computer usable storage device in a data processing system, and wherein the computer usable code is transferred over a network from a remote data processing system.

19. The computer usable program product of claim 15, wherein the computer usable code is stored in a computer usable storage device in a server data processing system, and wherein the computer usable code is downloaded over a network to a remote data processing system for use in a computer usable storage device associated with the remote data processing system.

20. A data processing system for reducing congestion using regional routing blockages in an integrated circuit (IC) design, the data processing system comprising:
   a storage device including a storage medium, wherein the storage device stores computer usable program code; and
   a processor, wherein the processor executes the computer usable program code, and wherein the computer usable program code comprises:
   computer usable code for detecting, at a set of layers in the IC design, a region of congestion, such that the region occupies the same area of each layer in the set of layers;
   computer usable code for defining, as a tuple, a routing blockage corresponding to the region, wherein the tuple comprises a set of coordinates to describe an area of the region, a first layer coordinate of a first layer in the set of layers, and a second layer coordinate in the set of layers;
   computer usable code for applying the routing blockage during an iteration of rough routing of the IC design;
   computer usable code for removing, before a detailed routing iteration of the IC design, the routing blockage;
   computer usable code for performing detailed routing using a g-cell in the region, wherein the detailed routing uses a routing capacity saved in the g-cell during the iteration of rough routing due to the routing blockage; and
   computer usable code for outputting a revised IC design, wherein in the revised design a revised congestion in an area corresponding to the region is less than a congestion in the region in the IC design.

* * * * *